(12) United States Patent
Ng et al.

(10) Patent No.: US 8,933,507 B2
(45) Date of Patent: Jan. 13, 2015

(54) METAL/POLYSILICON GATE TRENCH POWER MOSFET

(75) Inventors: Chun-Wai Ng, Hsinchu (TW); Hsueh-Liang Chou, Jhubei (TW); Po-Chih Su, Taipei (TW); Ruey-Hsin Liu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 4 days.

(21) Appl. No.: 13/545,131

(22) Filed: Jul. 10, 2012

(65) Prior Publication Data

US 2014/0015037 A1    Jan. 16, 2014

(51) Int. Cl.
*H01L 29/66* (2006.01)

(52) U.S. Cl.
USPC .................... 257/330; 438/270; 257/E21.419

(58) Field of Classification Search
None
See application file for complete search history.

(56) References Cited

U.S. PATENT DOCUMENTS

| 6,391,723 B1 | 5/2002 | Frisina | |
| 8,058,687 B2 * | 11/2011 | Tai et al. | 257/332 |
| 2005/0104093 A1 * | 5/2005 | Yoshimochi | 257/224 |
| 2007/0145519 A1 | 6/2007 | Peng et al. | |
| 2009/0029539 A1 * | 1/2009 | Sung et al. | 438/592 |
| 2009/0053880 A1 * | 2/2009 | Manabe | 438/524 |

\* cited by examiner

*Primary Examiner* — Wensing Kuo
*Assistant Examiner* — Shaka White
(74) *Attorney, Agent, or Firm* — Eschweiler & Associates, LLC

(57) ABSTRACT

The present disclosure relates to a power MOSFET device having a relatively low resistance hybrid gate electrode that enables good switching performance. In some embodiments, the power MOSFET device has a semiconductor body. An epitaxial layer is disposed on the semiconductor body. A hybrid gate electrode, which controls the flow of electrons between a source electrode and a drain electrode, is located within a trench extending into the epitaxial layer. The hybrid gate electrode has an inner region having a low resistance metal, an outer region having a polysilicon material, and a barrier region disposed between the inner region and the outer region. The low resistance of the inner region provides for a low resistance to the hybrid gate electrode that enables good switching performance for the power MOSFET device.

20 Claims, 16 Drawing Sheets

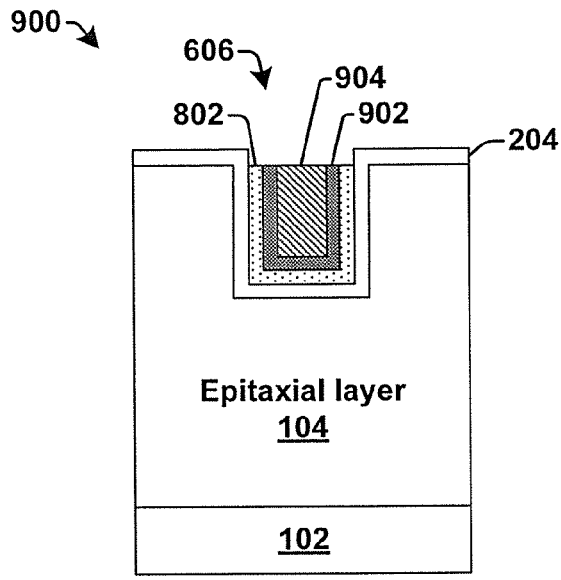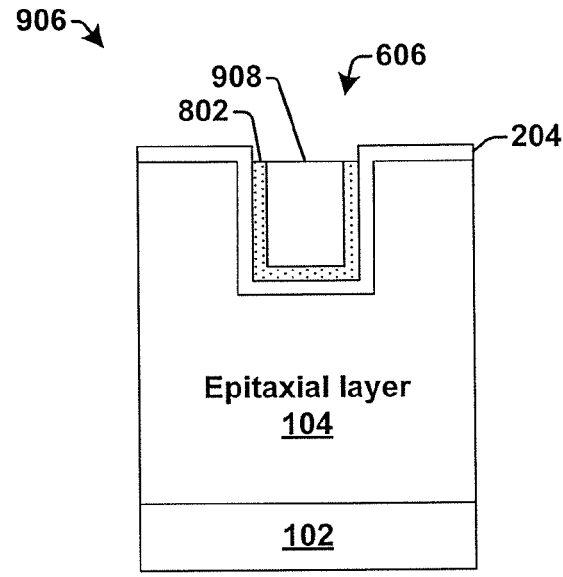
Fig. 9A  Fig. 9B
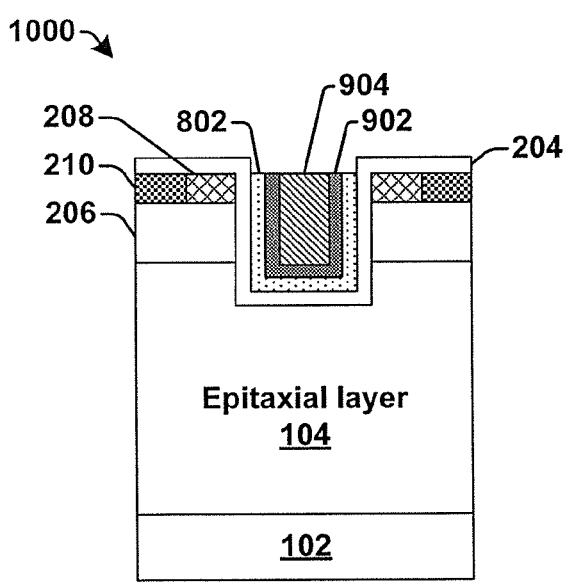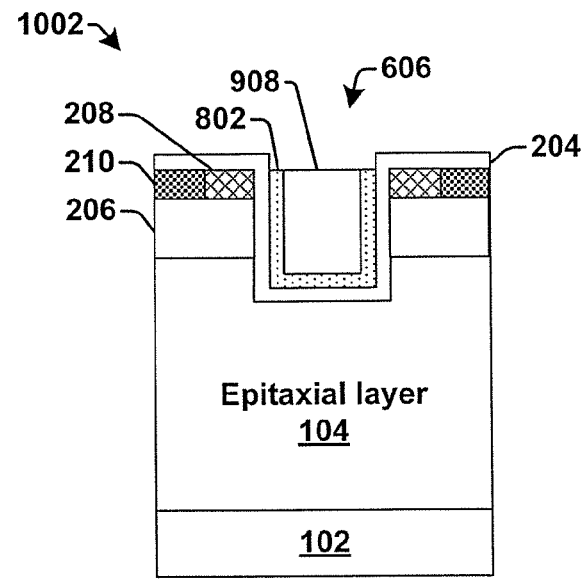
Fig. 10A  Fig. 10B

METAL/POLYSILICON GATE TRENCH POWER MOSFET

BACKGROUND

Power MOSFETs are MOS (metal-oxide semiconductor) transistor devices that are designed to handle high voltage levels. They are widely used in many portable electronic devices for applications such as voltage conversion, for example. Typically, power MOSFETs comprise a vertical diffused MOS (VDMOS) structure. In a vertical diffused MOS structure, the source and drain are positioned along a vertical axis, causing current to flow vertically through the device when the transistor is in an on state.

BRIEF DESCRIPTION OF THE DRAWINGS

FIGS. 5-12 illustrate cross-sectional views of some embodiments of the formation of a disclosed power MOSFET according to the method of FIG. 4.

DETAILED DESCRIPTION

Figure 1:
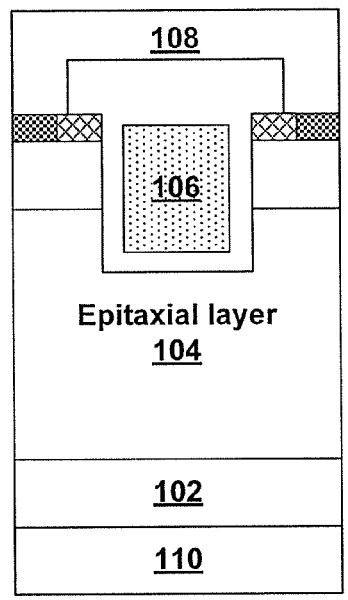
FIG. 1 illustrates a cross-sectional view of a power MOSFET.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1 illustrates a power MOSFET device 100 having a vertical device layout. The power MOSFET device 100 comprises a gate electrode 106 disposed within a trench extending into an epitaxial layer 104 located on a semiconductor body 102. The gate electrode 106 is configured to control the vertical flow of current from a source electrode 108 to a drain electrode 110. Typically, the gate electrode 112 comprises an in-situ doped poly-silicon material having a relatively high resistance. It has been appreciated that the high resistance of the gate electrode 106 limits the switching performance of power MOSFET device 100 and can cause non-uniform turn-on or turn-off of the device.

Accordingly, some aspects of the present disclosure provide for a power MOSFET device having a relatively low resistance hybrid gate electrode that enables good switching performance. In some embodiments, the power MOSFET comprises a semiconductor body. An epitaxial layer is disposed on the semiconductor body. A hybrid gate electrode, configured to control the flow of current between a source electrode and a drain electrode, is located within a trench extending into the epitaxial layer. The hybrid gate electrode comprises an inner region having a low resistance metal, an outer region having a polysilicon material, and a barrier region disposed between the inner region and the outer region. The low resistance of the inner region provides a low resistance to the hybrid gate electrode that enables good switching performance in the power MOSFET device.

Figure 2:
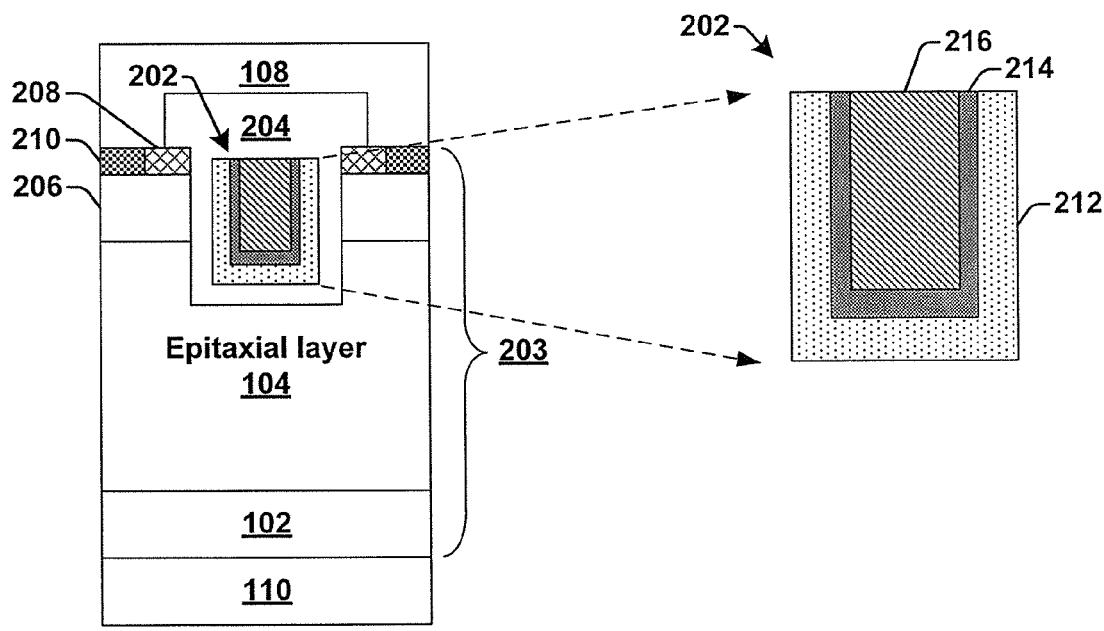
FIG. 2 illustrates a cross-sectional view of some embodiments of a power MOSFET having a disclosed hybrid gate electrode.

FIG. 2 illustrates some embodiments of a disclosed power MOSFET device 200. The power MOSFET device 200 comprises a source electrode 108, a hybrid gate electrode 202, and a drain electrode 110 located in a vertical direction along the device 200. The source electrode 108 is disposed on a top surface of a semiconductor substrate 203, while the hybrid gate electrode 202 is comprised within a trench extending into the semiconductor substrate 203 at a position that is vertically between the source electrode 108 and the drain electrode 110.

In some embodiments, the semiconductor substrate 203 comprises an epitaxial layer 104 located on a semiconductor body 102. The source electrode 108 is located on the epitaxial layer 104. Body regions 206 are disposed within the epitaxial layer 104 along opposite sides of a trench comprising an insulating material 204. First and second implantation regions, 208 and 210, are located within the respective body regions 206 at a position that is along a surface of the epitaxial layer 104.

In some embodiments, the epitaxial layer 104 and semiconductor body 102 comprise a first doping/concentration type (e.g., n-type). In such embodiments, the body region 206 has the first doping type, the first implantation region 208 has the first doping type, while the second implantation region 210 has a second doping type (e.g., p-type). The first implantation region 208 abuts the source electrode 108, and forms a drain region along with the epitaxial layer 104 and the body region 206. Using the epitaxial layer 104 as a part of the drain region gives the device 200 a vertical structure that allows the drain electrode 110 to be located on a side of the semiconductor body 102 that opposes the source electrode 116, resulting in a vertical current flow through the device 200.

The hybrid gate electrode 202 is located within a trench filled with an insulating material 204. The trench extends within the epitaxial layer 104, causing the hybrid gate electrode 202 to be laterally positioned between the body regions 206 and between the first and second implantation regions, 208 and 210. The insulating material 204 separates the hybrid gate electrode 202 from the epitaxial layer 104, the body region 206, the first implantation region 208, and the source electrode 108. In some embodiments, the insulating material 204 comprises an oxide layer such as silicon dioxide, for example.

During operation, the hybrid gate electrode 202 is configured to control the flow of current between the source electrode 108 and the drain electrode 110. For example, when a high voltage is applied to the hybrid gate electrode 202 it will form channels between the source electrode 108 and the drain electrode 110, resulting in separate vertical devices on either side of the hybrid gate electrode 202. The overall channel width of the power MOSFET device 200 is double that of a traditional MOSFET with a same die area, thereby allowing the power MOSFET device 200 to withstand large currents.

The hybrid gate electrode 202 comprises a plurality of nested regions 212-216. It will be appreciated that the disclosed hybrid gate electrode 202 may comprise any number of nested regions (e.g., 2, 3, 4, 5, . . . ). In some embodiments, the hybrid gate electrode 202 comprises three nested regions: an inner region 216, a barrier region 214, and an outer region 212. The inner region 216 is nested within the barrier region 214, so that the inner region 216 is comprised within a cavity in the barrier region 214. The barrier region 214 is nested within the outer region 212 so that the barrier region 214 and the inner region 216 are comprised within a cavity in the outer region 212. In some embodiments, two or more sides of an outer surface of the inner region 216 (i.e., a surface that is further from a center of the inner region 216) are in contact with two or more sides of an inner surface of the barrier region 214 (i.e., a surface that is closer to a center of the barrier region 214) and two or more sides of an outer surface of the barrier region 214 are in contact with two or more sides of an inner surface of the outer region 212.

One or more of the plurality of nested regions 212-216 comprise a low resistance metal. By forming one or more regions of the hybrid gate electrode 202 with a low resistance metal, the overall resistance of the hybrid gate electrode 202 is reduced relative to a conventional polysilicon gate electrode. The low resistance provides for improved switching performance over conventional polysilicon gates, which allows for power MOSFET device 200 to be switched on or off uniformly In some embodiments, the inner region 216 comprises a low resistance metal and the outer region 212 comprises a polysilicon material. The low resistance metal provides a low resistance to the hybrid gate electrode while the polysilicon material provides for a good interface between the hybrid gate electrode 202 and the insulating material 204 (e.g., gate-source dielectric). In some embodiments, the barrier region 214 may comprise a barrier layer having a material that is selected to provide a good connection (i.e., good conductivity) between the low resistance metal and the polysilicon material.

In various embodiments, the inner region 216 comprises a low resistance metal comprising tungsten (W), titanium (Ti), Cobalt (Co), Aluminum (Al), Copper (Cu), or another similar metal. In various embodiments, the barrier region 214 comprises a barrier layer comprising Cobalt (Co), tantalum (Ta), tantalum nitride (TaN), tungsten nitride (WN), titanium nitride (TiN), titanium tungsten (TiW), or another similar metal.

Although FIG. 2 illustrates the hybrid gate electrode 202 comprised within a vertical drain power MOSFET device having a backside drain electrode 110, it will be that the hybrid gate electrode is not limited to vertical drain power MOSFET devices having such configurations. For example, in some embodiments, the hybrid gate electrode is comprised within a quasi-vertical drain power MOSFET devices having drain electrode extending from a surface of the epitaxial layer to a buried layer below the epitaxial layer.

Figure 3:
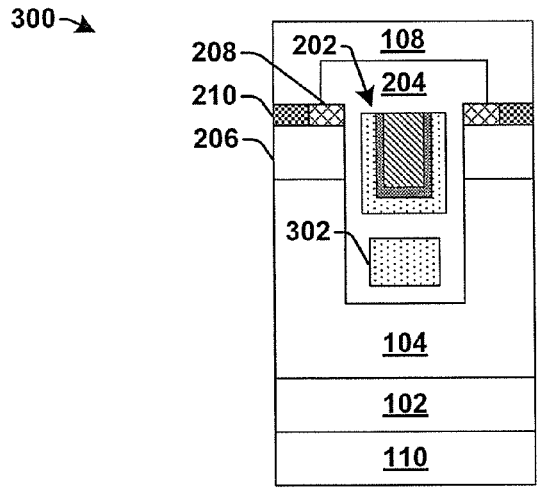
FIG. 3 illustrates a cross-sectional view of some alternative embodiments of a power MOSFET having a disclosed hybrid gate electrode.

FIG. 3 illustrates some alternative embodiments of a disclosed power MOSFET device 300. The power MOSFET device 300 comprises a source electrode 108, a hybrid gate electrode 202, and a drain electrode 110 located in a vertical direction as described above. The power MOSFET device 300 further comprises a field plate 302. The field plate 302 is located within a trench filled with an insulating material 204 and comprising the hybrid gate electrode 202. The trench extends into the epitaxial layer 104. The field plate 302 is located at a position that is vertically below the hybrid gate electrode 202 (e.g., that is vertically positioned between the hybrid gate electrode 202 and the drain electrode 110) and is separated from the epitaxial layer 104 and from the hybrid gate electrode 202 by insulating material 204. The field plate 302 is configured to operate upon the channels on the left and right of the hybrid gate electrode 202 to influence the channel characteristics within the drain region (e.g., to extend a depletion edge from the hybrid gate electrode 202 by shifting the peak electric field from the edge of the hybrid gate electrode 202 to the edge of the field plate 302). In some embodiments, the field plate 302 comprises a polysilicon material.

Figure 4:
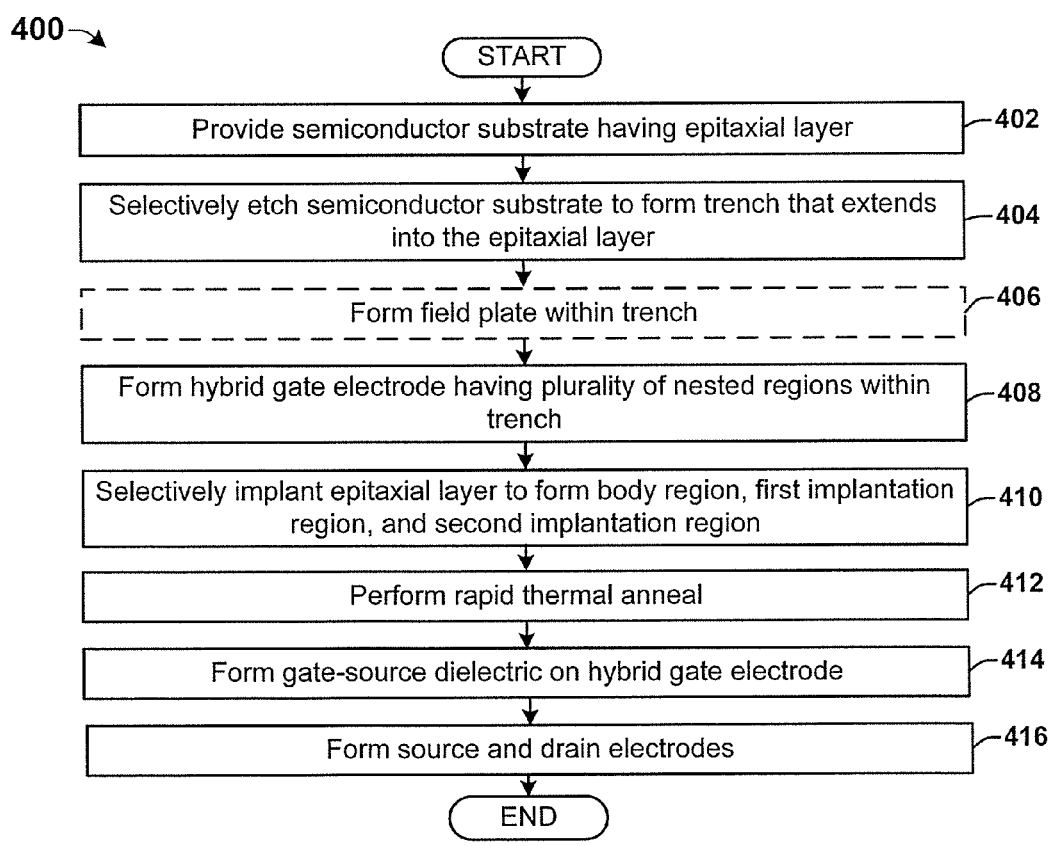
FIG. 4 illustrates a method of forming a vertical power MOSFET having a disclosed hybrid gate electrode, in accordance with some embodiments.

FIG. 4 illustrates a method 400 of forming a vertical power MOSFET having a disclosed hybrid gate electrode, in accordance with some embodiments.

At step 402, a semiconductor substrate having an epitaxial layer is provided. The semiconductor substrate comprises an epitaxial layer formed over a semiconductor body.

At step 404, the semiconductor substrate is selectively etched to form a trench that extends into the epitaxial layer. The trench extends from a surface of the epitaxial layer opposite the semiconductor body to a depth within the epitaxial layer.

In some embodiments, a field plate is formed within the trench at step 406.

At step 408, a hybrid gate electrode is formed within the trench. The hybrid gate electrode comprises a plurality of nested regions, wherein one or more of the plurality of nested regions comprise a low resistance metal (i.e., a metal having a resistance less than polysilicon).

At step 410, the epitaxial layer is selectively implanted to form a body region, a first implantation region, and a second implantation region. In some embodiments, the first implantation region comprises a p+ doped region and the second implantation region comprises an n+ doped region.

At step 412, a rapid thermal anneal is performed to activate the implanted dopants.

At step 414, a gate-source dielectric is formed on the hybrid gate electrode.

At step 416, source and drain electrodes are formed. In some embodiments, the source electrode is formed on a first side of the substrate, while the drain electrode is formed on a backside of the substrate.

Some embodiments of an exemplary semiconductor substrate, whereon such a method 400 is implemented, are illustrated in cross-sectional views of FIGS. 5-12. It will be appreciated that the cross-sectional views of FIGS. 5-12 illustrate non-limiting examples of a method for forming a power MOSFET having the disclosed hybrid gate electrode. One of ordinary skill in the art will appreciate that the structure of the power MOSFET may be achieved according to variations on the disclosed cross-sectional views.

Figure 5:
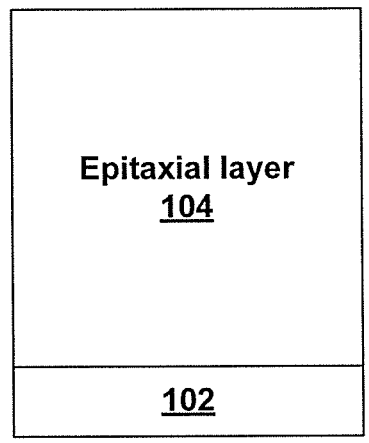

FIG. 5 illustrates a cross-sectional view 500 of some embodiments of a semiconductor substrate corresponding to the substrate of step 402. The semiconductor substrate comprises an epitaxial layer 104 formed on a semiconductor body 102. The semiconductor body 102 may comprise any semiconductor material, such as silicon, germanium, gallium arsenide, etc. In some embodiments, the epitaxial layer 104 is formed on the semiconductor body 102 by way of vapor-phase epitaxy. Typically, the epitaxial layer 104 is formed to have a dopant concentration that is greater than that of the semiconductor body 102. In some embodiments, the semiconductor body 102 and the epitaxial layer 104 comprise a first doping/conductivity type (e.g., n-type doping). In other embodiments, the semiconductor body 102 comprises the first doping type, while the epitaxial layer 104 comprises a second doping type (e.g., p-type doping).

Figure 6:
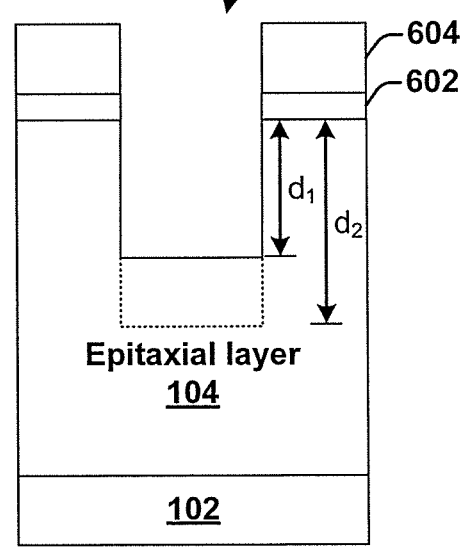

FIG. 6 illustrates a cross-sectional view 600 of some embodiments of a semiconductor substrate corresponding to step 404. As shown in cross-sectional view 600, a pad oxide 602 has been formed on the surface of the epitaxial layer 104 and a hard mask 604 has been formed above the pad oxide 602. In some embodiments, the pad oxide 602 comprises silicon dioxide ($SiO_2$), for example. In some embodiments, the hard mask 604 comprises a nitride layer (e.g., $Si_3N_4$), for example. The hard mask 604 and pad oxide 602 are selectively etched to form an opening that exposes a region of the underlying epitaxial layer 104. In some embodiments, wherein the hard mask 604 comprises a nitride hard mask, a wet etch with an etching chemistry comprising hydrofluoric acid (HF), buffered HF, or phosphoric acid ($H_3PO_4$) is used to etch an opening in the hard mask 604. The substrate is subsequently etched at the opening to form a trench 606 extending into the epitaxial layer 104. In some embodiments, the epitaxial layer 104 is etched using a plasma etch comprising a $CHF_3$ and/or $CF_4$ chemistry or a wet etch using KOH, for example.

It will be appreciated that the depth of the trench 606 will depend upon whether or not the power MOSFET device comprises a field plate. In embodiments wherein the power MOSFET device does not comprise a field plate, the trench 606 will be etched to a first depth $d_1$. In embodiments wherein the power MOSFET device comprises a field plate, the trench 606 will be etched to a second depth $d_2$, which is greater than the first depth $d_1$.

Figure 7A:
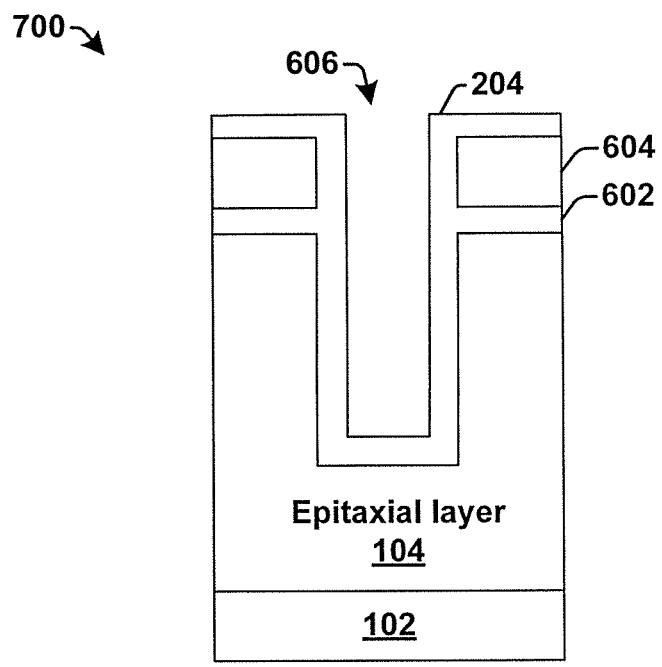
Figure 7B:
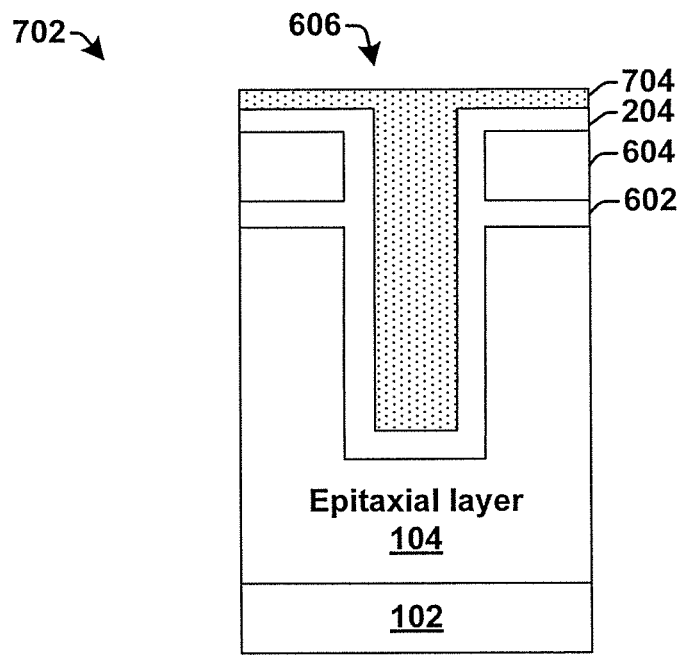
Figure 7C:
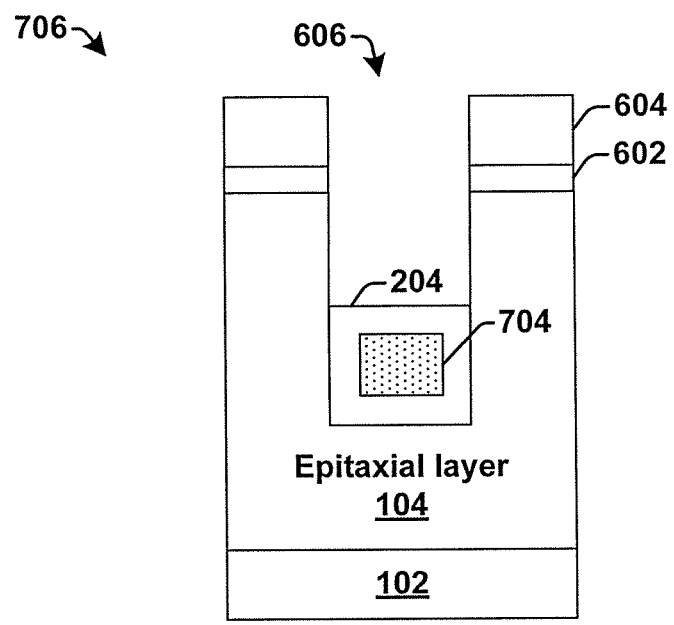

FIGS. 7A-7C respectively illustrate cross-sectional views 700-704 of some embodiments of a semiconductor substrate corresponding to step 406. As shown in cross-sectional view 700, an insulating material 204 is formed on the substrate. The insulating material 204 is formed on the bottom and sidewalls of the trench 606. In various embodiments, the insulating material 204 comprises silicon dioxide or a low-k dielectric material formed using a spin-on dielectric, a thermal process, or a deposition process.

As shown in cross-sectional view 702, a first polysilicon layer 704 is deposited onto the substrate above the insulating material 204. In some embodiments, the first polysilicon layer 704 is formed by thermally decomposing silane ($SiH_4$) inside a low-pressure processing chamber at an elevated temperature (e.g., 500-700° C.). The first polysilicon layer 704 is formed to a thickness that fills the trench 606.

As shown in cross-sectional view 706, the first polysilicon layer 704 is etched back (e.g., using a plasma etch with an etch chemistry comprising $SF_6$) so that it is contained within the trench 606. An insulating material 204 (e.g., oxide layer) is then deposited on the substrate above the first polysilicon layer 704, and is subsequently etched to form a field plate within the trench 606.

Figure 8:
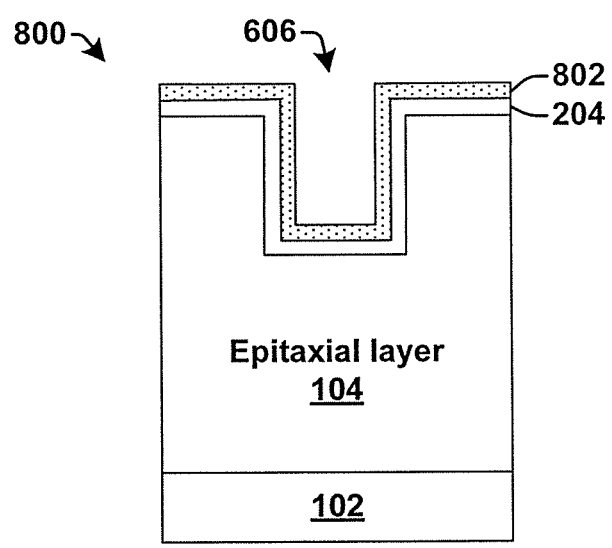

FIGS. 8 and 9A respectively illustrate cross-sectional views 800, 900 of some embodiments of a semiconductor substrate corresponding to step 408. The cross-sectional views 800 and 900 are shown without a field plate (e.g., as formed in FIGS. 7A-7C) but in some alternative embodiments, a field plate may be present.

As shown in cross-sectional view 800, the pad oxide 602 and hard mask 604 are removed and an insulating material 204 is formed on the substrate. In various embodiments, the insulating material 204 is formed using a spin-on dielectric, a thermal process, or a deposition process. A second polysilicon layer 802 is then formed on the substrate above the insulating material 204. In some embodiments, the second polysilicon layer 802 is formed by thermally decomposing silane ($SiH_4$) at low-pressure, as described above.

As shown in cross-sectional view 900, a barrier layer 902 is deposited onto the substrate above the second polysilicon layer 802. A low resistance metal 904 is then deposited on the substrate above the barrier layer 902. In some embodiments, the barrier layer 902 and the low resistance metal 904 are deposited onto the substrate by physical vapor deposition (e.g., sputtering or evaporation). The barrier layer 902 and the low resistance metal 904 are deposited to a thickness that causes a combination of the second polysilicon layer 802, the barrier layer 902, and the low resistance metal 904 to fill the trench 606. The substrate is then selectively masked and the second polysilicon layer 802, the barrier layer 902, and the low resistance metal 904 are etched to define a hybrid gate electrode within the trench 606. The resulting hybrid gate electrode comprises a structure in which the low resistance metal 904 is nested within the barrier layer 902, which is nested within the second polysilicon layer 802.

FIG. 10A illustrates a cross-sectional view 1000 of some embodiments of a semiconductor substrate corresponding to step 410. As shown in cross-sectional view 1000, a plurality of implantations are performed to form a body region 206, a first implantation region 208, and a second implantation region 210.

In some embodiments, the body region 206 is formed by masking the substrate (e.g., with photoresist) and performing a body implantation using a dopant having a first doping type and a dose ranging from approximately $10^{13}$ atoms/cm$^2$ to approximately $10^{14}$ atoms/cm$^2$. In some embodiments, the first implantation region 208 is formed by masking the substrate (e.g., with photoresist) and implanting a dopant having the first doping type and a dose ranging from approximately $10^{15}$ atoms/cm$^2$ to approximately $10^{16}$ atoms/cm$^2$. In some embodiments, the second implantation region 210 is formed by masking the substrate (e.g., with photoresist) and implanting a dopant having a second doping type and a dose ranging from approximately $10^{15}$ atoms/cm$^2$ to approximately $10^{16}$ atoms/cm$^2$. In some embodiments, the first doping type comprises an n-type dopant (e.g., phosphorus, arsenic), while the second doping type comprises a p-type dopant (e.g., boron). In such embodiments, the body region 206 comprises an n-type doping concentration, the first implantation region 208 comprises an n+ implantation region, while the second implantation region 210 comprises a p+ implantation region.

Figures 11A, 11B:
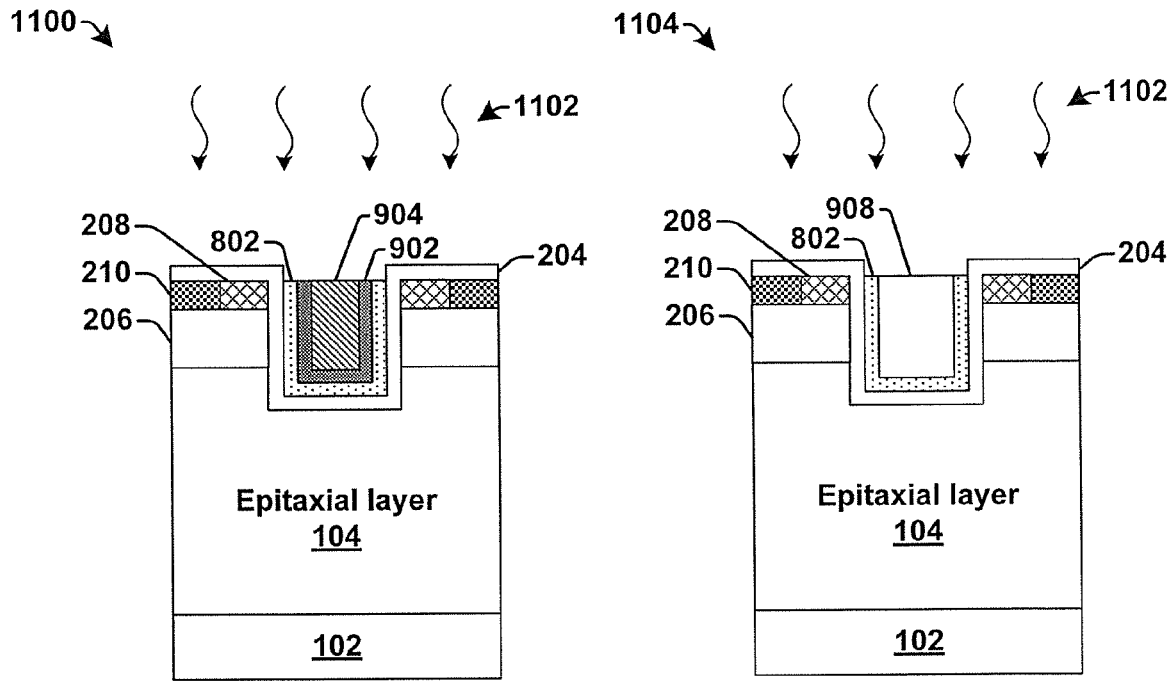

FIG. 11A illustrates a cross-sectional view 1100 of some embodiments of a semiconductor substrate corresponding to step 412. As shown in cross-sectional view 1100, a rapid thermal anneal 1102 is performed after the one or more implantations to activate the implanted dopants (e.g., the first and second implantation regions). In some embodiments, the rapid thermal anneal 1102 is performed by exposing the substrate to a high temperature (e.g., 1200° C.) for a short period of time (e.g., less than 5 seconds). To prevent the high temperature of the rapid thermal anneal 1102 from damaging the barrier layer 902 and the low resistance metal 904, the barrier layer 902 and the low resistance metal 904 may comprise refractory metals. For example, the barrier layer 902 may comprise tantalum (Ta) and the low resistance metal 904 may comprise tungsten (W). The refractory metals having a high resistance to the heat of the rapid thermal anneal.

Figure 12:
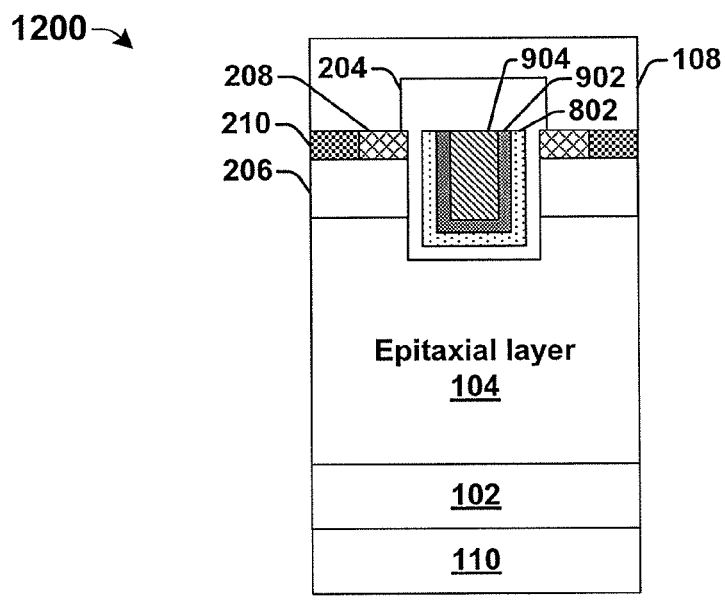

FIG. 12 illustrates a cross-sectional view 1200 of some embodiments of a semiconductor substrate corresponding to steps 414-416. As shown in cross-sectional view 1200, an insulating material 204 comprising a gate-source dielectric is formed above the hybrid gate electrode. A drain electrode 110 and a source electrode 108 are then formed by metallization processes. For example, a source electrode 108 may be formed by depositing a metal (e.g., nickel) above insulating material 204 using a physical vapor deposition. Similarly, a drain electrode 110 may be formed by depositing a metal (e.g., nickel) on a backside of the semiconductor body 102 using physical vapor deposition. In some embodiments, a passivation is performed on the deposited metal.

Figure 13:
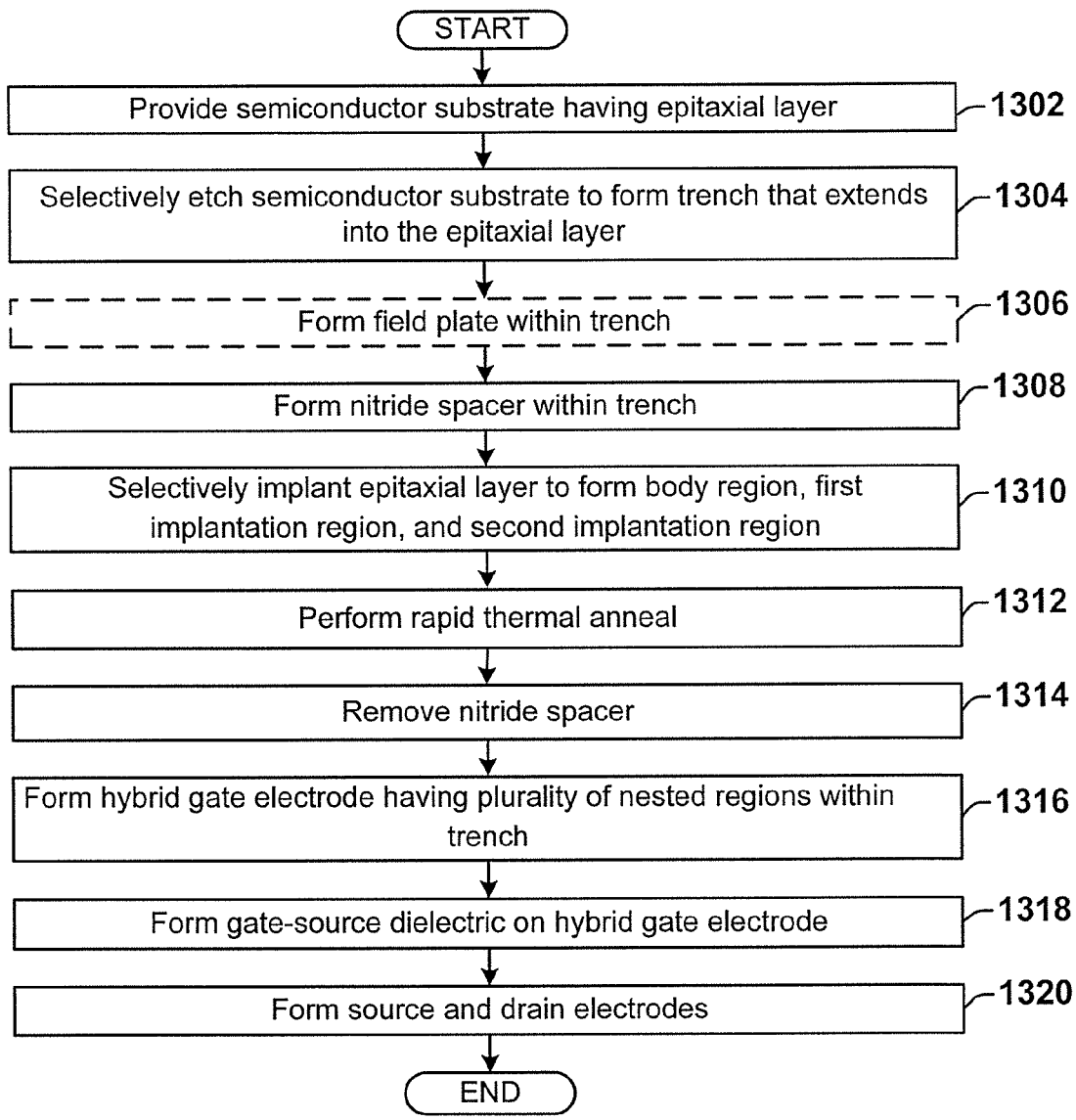
FIG. 13 illustrates a method of forming a quasi-vertical power MOSFET having a disclosed hybrid gate electrode, in accordance with some alternative embodiments.

FIG. 13 illustrates some alternative embodiments of a method 1300 of forming a vertical power MOSFET having a disclosed gate structure.

Steps 1302-1306 are the same as steps 402-406 in method 400.

At step 1308, a nitride spacer is formed within the trench. Cross-sectional view 906 of FIG. 9B, illustrates a nitride layer 908 deposited onto the substrate. As shown in cross-sectional view 906, the nitride layer 908 is formed within the trench 606 at a position that is nested within the second polysilicon layer 802. The nitride layer 908 is in contact with the second polysilicon layer 802 and is formed to a thickness that fills the trench 606, resulting in a nitride spacer. In some embodiments, the nitride layer 908 comprises silicon-nitride, for example.

At step 1310, the epitaxial layer is selectively implanted to form a body region, a first implantation region, and a second implantation region. Cross-sectional view 1002 of FIG. 10B, illustrates implantation of the epitaxial layer 104. As shown in cross-sectional view 1002, nitride spacer 908 acts as a hard mask to prevent dopants from being implanted within the trench 606, while still allowing dopants to be implanted into the epitaxial layer 104.

At step 1312, a rapid thermal anneal is performed to activate the implanted dopants. Cross-sectional view 1104 of FIG. 11B illustrates a rapid thermal anneal 1102 of the substrate. The use of a nitride spacer 908 within the trench 606 allows for the rapid thermal anneal 1102 to be performed before depositing the low resistance metal and the barrier layer.

The nitride spacer is removed after the rapid thermal anneal is completed, at step 1312. In some embodiments, the nitride spacer may be removed by masking the substrate and then selectively etching the nitride spacer using a wet etchant comprising an etching chemistry of hydrofluoric acid (HF), buffered HF, or phosphoric acid ($H_3PO_4$), for example.

At step 1314, the barrier layer and low resistance metal are deposited within the trench and etched so as to take the place of the removed nitride spacer. Cross section 1200 of FIG. 12, illustrates formation of a barrier layer 902 and a low resistance metal 904 in place of the removed nitride spacer. Since the low resistance metal 904 and barrier layer 902 are not exposed to the rapid thermal anneal 1102, non-refractory metals having a lower resistance than the refractory metals can be used for the low resistance metal 904 and the barrier layer 902. For example, the barrier layer 902 may comprise aluminum (Al) and the low resistance metal 904 may comprise cobalt (Co).

At step 1316, a gate-source dielectric is formed above the hybrid gate electrode. Cross sectional view 1200 of FIG. 12, illustrates formation of an insulating material 204 comprising a gate-source dielectric above the hybrid gate electrode.

At step 1318, a source electrode and a drain electrode are formed. Cross sectional view 1200 of FIG. 12, illustrates formation of a source electrode 108 and a drain electrode 110. The resulting power MOSFET comprises a structure that is the same as that resulting from method 400, but with a low resistance metal 904 and a barrier layer 902 comprising non-refractory metals.

Figure 14:
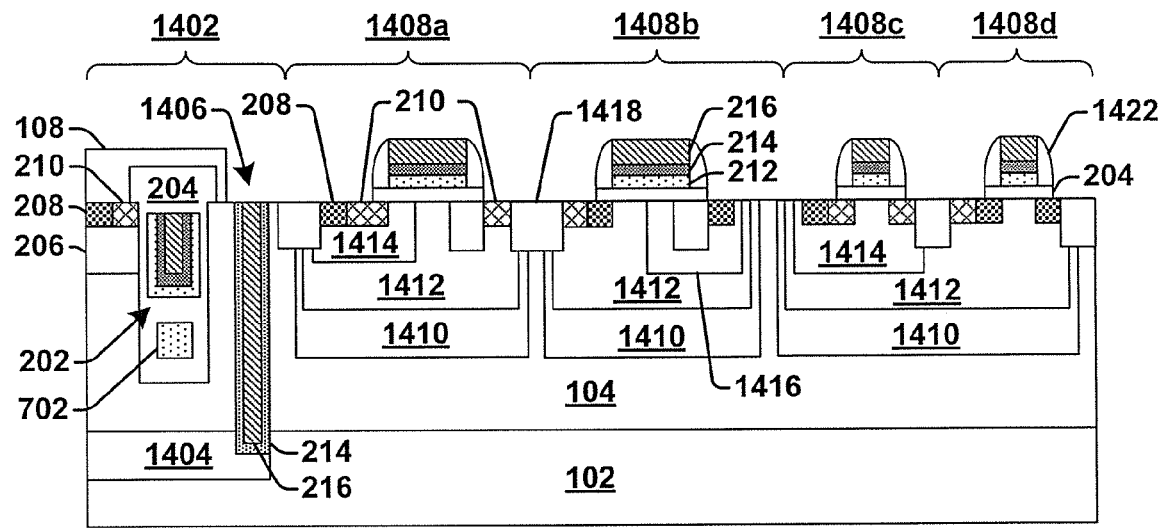
FIG. 14 illustrates a cross-sectional view of some embodiments of an integrated quasi-vertical power MOSFET having a disclosed hybrid gate structure.
Figure 15:
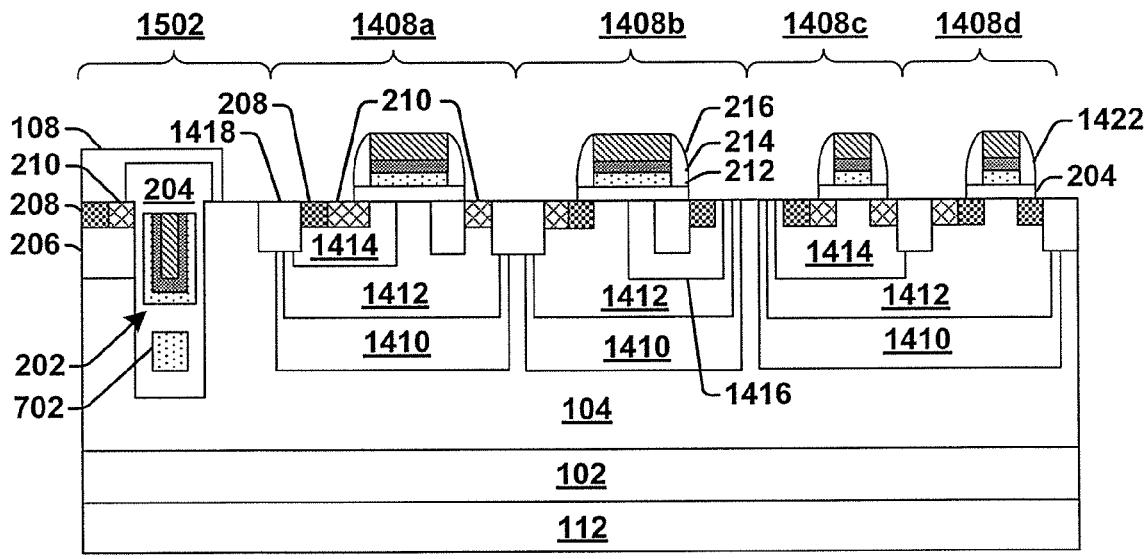
FIG. 15 illustrates a cross-sectional view of some embodiments of an integrated vertical power MOSFET having a disclosed hybrid gate structure.

In some embodiments, the disclosed power MOSFET device can be formed within a semiconductor substrate comprising one or more lateral MOS devices 1408 (e.g., lateral power and/or CMOS devices). FIGS. 14-15 respectively illustrate cross-sectional views 1400 and 1500 of some embodiments of a power MOSFET integrated with one or more lateral MOS devices.

FIG. 14 illustrates a cross-sectional view 1400 of some embodiments of a quasi-vertical power MOSFET 1402, having a disclosed hybrid gate electrode, integrated into a silicon substrate having one or more lateral MOS devices (i.e., an integrated quasi-vertical power MOSFET).

The quasi-vertical power MOSFET 1402 comprises a source electrode 108 and a hybrid gate electrode 202 located in a vertical direction along the device 1400. A drain region comprises an epitaxial layer 104 having a first doping type (e.g., n-type) located on a semiconductor body 102 having a second doping type (e.g., p-type). The drain region further comprises a buried layer 1404 having the first doping type, which is located between the semiconductor body 102 and the epitaxial layer 104. A drain electrode 1406 is comprised within a trench that extends from the surface of the epitaxial layer 104 to the buried layer 1404. During operation, current flows from the source electrode 108, through the epitaxial layer 104 and the buried layer 1404 to drain electrode 1406.

A body region 206 having the first doping type is disposed within the epitaxial layer 104 along a side of an insulating material 204 filled trench that opposes the drain electrode 1406. First and second implantation regions, 208 and 210, are located within the body region 206 at a position that is along a surface of the epitaxial layer 104. The first implantation region 208 has the first doping type, while the second implantation region 210 has the second doping type.

One or more lateral MOS devices 1408 are located within the epitaxial layer 104. The lateral MOS devices 1408 are separated by insulating regions 1418 (e.g., STI regions). In various non-limiting embodiments, the lateral MOS devices 1408 comprise a high voltage NMOS 1408*a*, a high voltage PMOS 1408*b*, a low voltage NMOS 1408*c*, a low voltage PMOS, 1408*d* or a combination thereof. The lateral MOS devices 1408 comprise a deep well 1410 having a second doping type and a high voltage well 1412 having a second doping type. The high voltage NMOS 1408*a* further comprises a shallow well 1414 having the second doping type and implantation regions 208 and 210, as shown. The high voltage PMOS 1408*b* further comprises a shallow well 1416 having the second doping type and implantation regions 208 and 210, as shown. The low voltage NMOS 1408*c* further comprises a shallow well 1418 having the second doping type and implantation regions 208 and 210, as shown. The low voltage PMOS 1408*d* further comprises implantation regions 208 and 210, as shown.

FIG. 15 illustrates a cross-sectional view 1500 of some embodiments of a vertical power MOSFET device 1502, having a disclosed hybrid gate electrode, integrated into a silicon substrate having one or more lateral MOS devices (i.e., an integrated vertical power MOSFET).

The vertical power MOSFET device 1502 comprises a source electrode 108, a hybrid gate electrode 202, and a drain electrode 110 located in a vertical direction along the device 1400. A drain region comprises an epitaxial layer 104 having a first doping type (e.g., n-type) located on a semiconductor body 102 having the first doping type (e.g., n-type). A body region 206 having the first doping type is disposed within the epitaxial layer 104 along a side of an insulating material 204 filled trench. First and second implantation regions, 208 and 210, are located within the body region 206 at a position that is along a surface of the epitaxial layer 104. The first implantation region 208 has the first doping type, while the second implantation region 210 has the second doping type. The one or more lateral MOS devices 1408 are located within the epitaxial layer 104, as described above.

Figure 16:
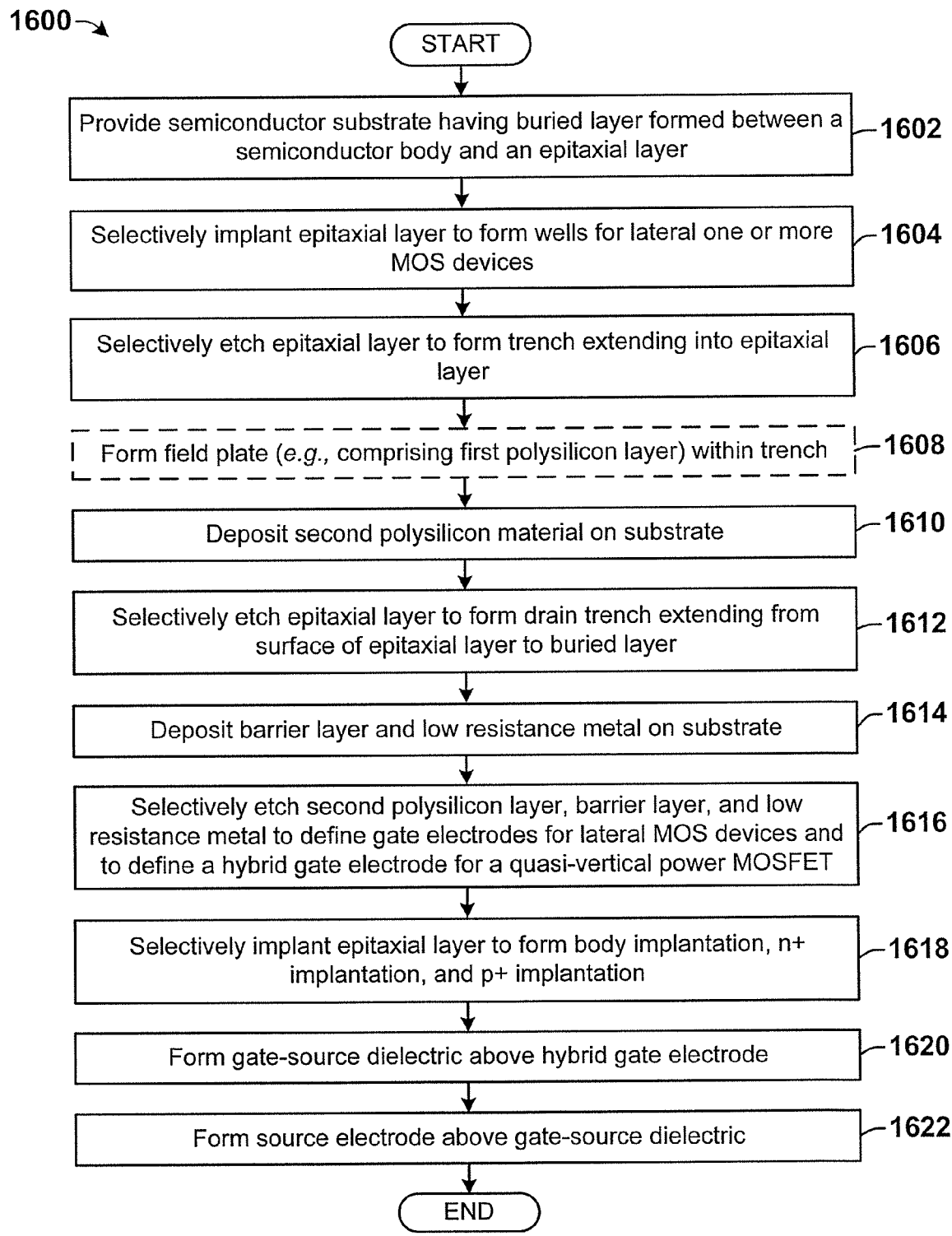
FIG. 16 illustrates a method of forming an integrated quasi-vertical power MOSFET having a disclosed hybrid gate structure, in accordance with some embodiments.

FIG. 16 illustrates some embodiments of a method 1600 of forming an integrated quasi-vertical power MOSFET having a disclosed hybrid gate electrode.

At step 1602, a semiconductor substrate having a buried layer formed between a semiconductor body and an epitaxial layer is provided.

At step 1604, the epitaxial layer is selectively implanted to form one or more wells for one or more lateral MOS devices.

At step 1606, the semiconductor substrate is selectively etched to form a trench that extends into the epitaxial layer. The trench extends from a surface of the epitaxial layer opposite the semiconductor body to a depth within the epitaxial layer.

In some embodiments, a field plate is formed within the trench at step 1608. In some embodiments, the field plate comprises a first polysilicon layer formed in the trench and surrounded by an insulating material.

At step 1610, a second polysilicon material is deposited on the surface of the substrate.

At step 1612, the semiconductor substrate is selectively etched to form a drain trench that extends into the epitaxial layer.

A barrier layer and low resistance metal are deposited on the surface of the substrate at step 1614.

At step 1616, the second polysilicon layer, the barrier layer, and the low resistance metal are selectively etched to define gate electrodes for the lateral MOS devices and to define a hybrid gate electrode for a quasi-vertical power MOSFET device.

At step 1618, the epitaxial layer is selectively implanted to form a body implantation region, a p+ implantation region, and an n+ implantation region.

At step 1620, a gate-source dielectric is formed above the hybrid gate electrode.

At step 1622, a source electrode is formed above the gate-source dielectric.

Some embodiments of an exemplary semiconductor substrate, whereon such a method 1600 is implemented, are illustrated in cross-sectional views of FIGS. 17-25.

Figure 17:
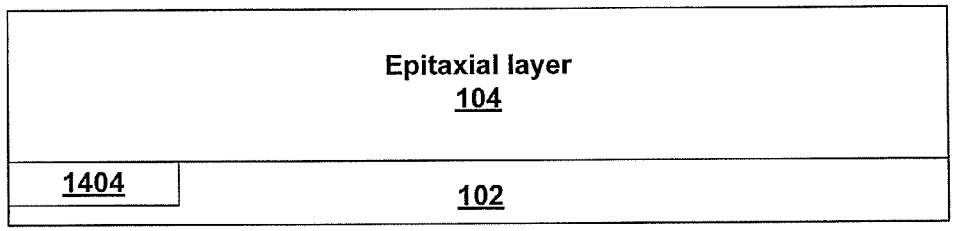
FIGS. 17-25 illustrate cross-sectional views of some embodiments of the formation of an integrated quasi-vertical power MOSFET according to the method of FIG. 16.

FIG. 17 illustrates a cross-sectional view 1700 of some embodiments of a semiconductor substrate corresponding to the substrate of step 1602. The semiconductor substrate includes a semiconductor body 102 (e.g., silicon or SiGe) and an epitaxial layer 104 formed thereover. A buried layer 1404 is formed by implanting the semiconductor body 102 with a dopant to raise the dopant concentration of the buried layer 1402 to a level greater than that of the semiconductor body 102 and the epitaxial layer 104. In some embodiments, the buried layer 1402 is formed by implanting the semiconductor body 102 with a doping concentration in the range of approximately $1 \times 10^{18}$ cm$^{-3}$ to approximately $1 \times 10^{21}$ cm$^{-3}$. In some embodiments, the semiconductor body 102 has a first doping type, while the epitaxial layer 104 and the buried layer 1404 both have a second doping type.

Figure 18:
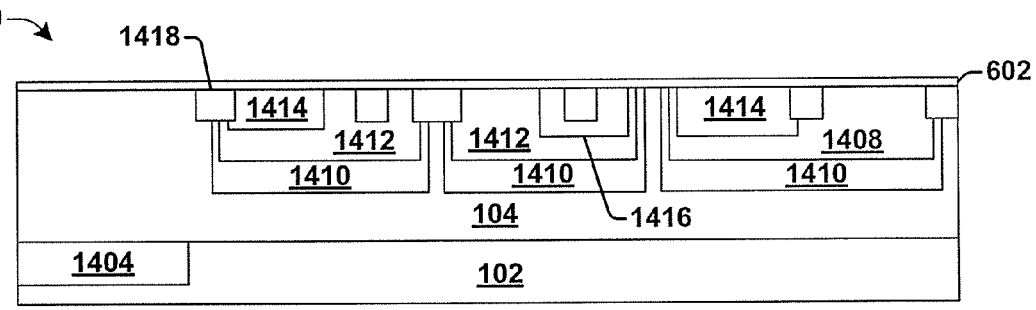

FIG. 18 illustrates a cross-sectional view 1800 of some embodiments of a semiconductor substrate corresponding to the substrate of step 1604. One or more active areas are formed within the substrate by way of implantation. In some embodiments, the active areas comprises a deep well 1410 formed by masking the substrate and implanting dopants (e.g., boron) having the first doping type (e.g., p-type) with a dose doping concentration ranging from approximately $10^{15}$ cm$^{-3}$ to approximately $10^{18}$ cm$^{-3}$. In some embodiments, the active areas comprises a high voltage well 1412 comprised within the deep well 1410 and formed by masking the substrate and implanting dopants (e.g., phosphorus) having the second doping type (e.g., n-type) with a doping concentration ranging from approximately $10^{15}$ cm$^{-3}$ to approximately $10^{18}$ cm$^{-3}$. In some embodiments, the active areas may further comprise shallow wells comprised within the deep well 1412 and formed by implanting dopants having the first doping type with a doping concentration ranging from approximately $10^{15}$ cm$^{-1}$ to approximately $10^{18}$ cm$^{-3}$. One of ordinary skill in the art, will appreciated that in various embodiments, the shallow wells may comprise a 5 volt p-well 1414, a p-well diffused drain implantation 1416, or other similar wells.

Cross sectional view 1800 further illustrates a pad oxide 602 (e.g., silicon oxide) formed over the surface of the substrate prior to formation of the insulating regions 1418. The pad oxide 602 prevents tension on the underlying substrate during formation of the insulating regions 1418. In various embodiments, the insulating regions 1418 are formed within a surface of the substrate (e.g., the epitaxial layer 104) using conventional LOCOS or shallow trench isolation (STI) techniques, for example.

Figure 19:
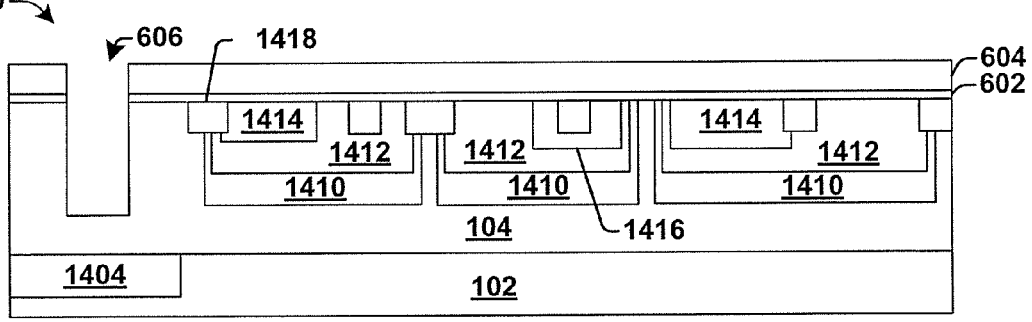

FIG. 19 illustrates a cross-sectional view 1900 of some embodiments of a semiconductor substrate corresponding to the substrate of step 1606. As shown in cross-sectional view 1900, a hard mask 604 (e.g., a nitride hard mask) is formed on the epitaxial layer 104. The hard mask 604 and underlying pad oxide 602 are selectively patterned to form an opening that exposes a region of the underlying epitaxial layer 104, which is etched to form a trench 606 within the epitaxial layer 104.

Figure 20:
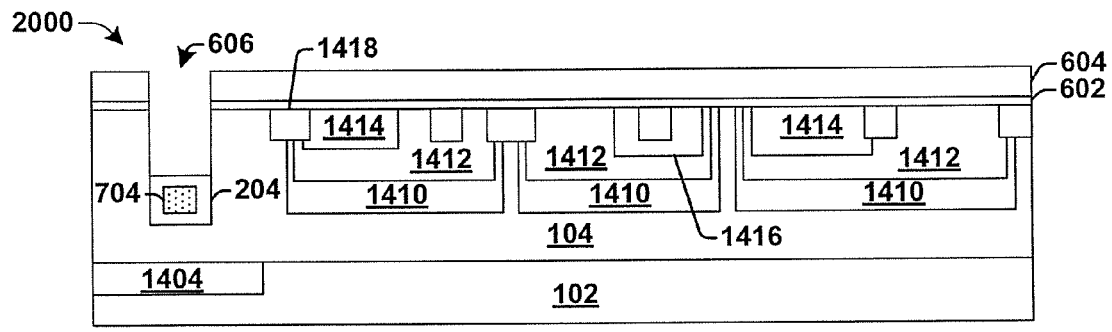

FIG. 20 illustrates a cross-sectional view 2000 of some embodiments of a semiconductor substrate corresponding to the substrate of step 1608. As shown in cross-sectional view 2000, an insulating material 204 is deposited within the trench 606. A first polysilicon layer 704 is then deposited within trench 606, and is etched to define the field plate. An insulating material 204 is formed above the first polysilicon layer 704.

Figure 21:
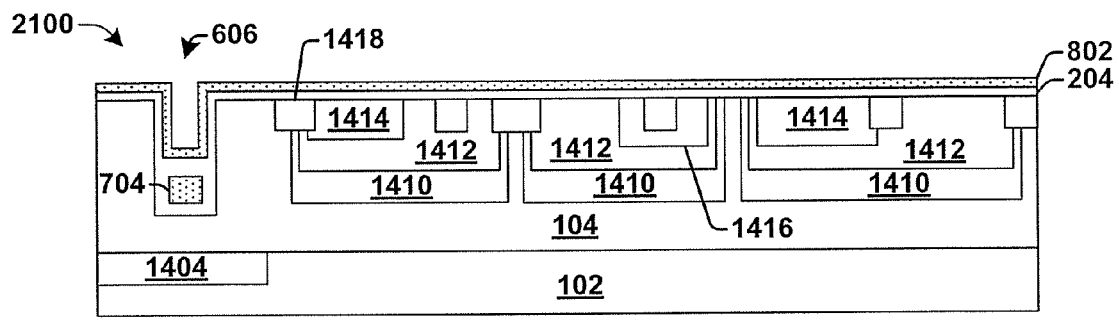

FIG. 21 illustrates a cross-sectional view 2100 of some embodiments of a semiconductor substrate corresponding to the substrate of step 1610. In cross-sectional view 2100, the pad oxide 602 and the hard mask 604 are removed from the substrate. An insulating material 204 is then formed on the substrate. A second polysilicon layer 802 is formed on the substrate above the insulating material 204.

Figure 22:
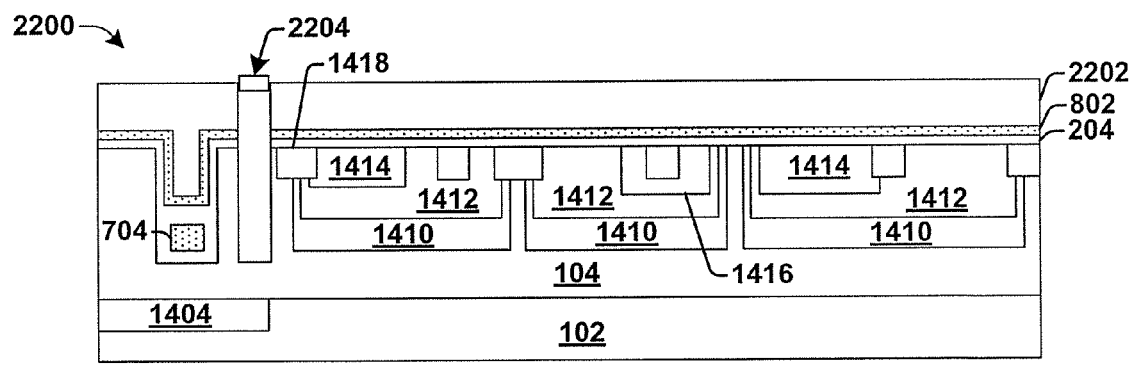

FIG. 22 illustrates a cross-sectional view 2200 of some embodiments of a semiconductor substrate corresponding to the substrate of step 1612. As shown in cross-sectional view 2200, a hard mask 2202 is formed on the substrate. The hard mask 2202 is selectively patterned to form an opening. The second polysilicon layer 802, the insulating material 204, and epitaxial layer 104 are then etched to from a drain trench 2204 extending from the top of the epitaxial layer 104 to the buried layer 1404.

Figure 23:
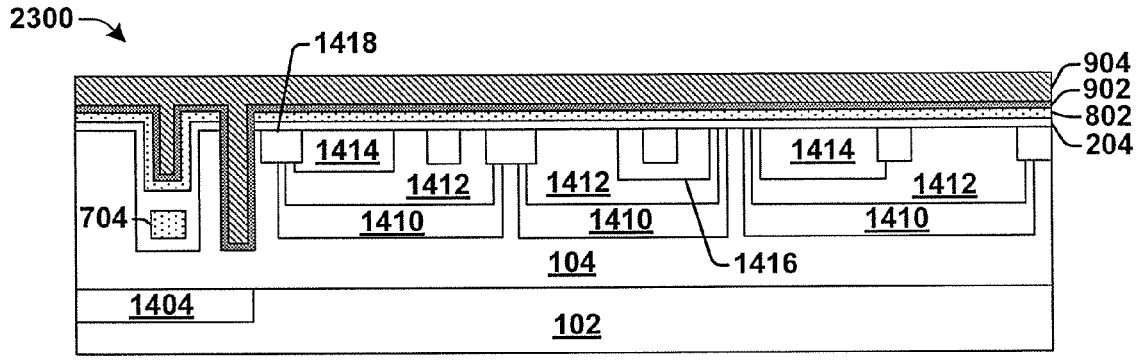

FIG. 23 illustrates a cross-sectional view 2300 of some embodiments of a semiconductor substrate corresponding to the substrate of step 1614. As shown in cross-sectional view 2300, a barrier layer 902 and a low resistance metal 904 are deposited on the substrate. In some embodiments, the barrier layer 902 and the low resistance metal 904 are deposited onto the substrate by physical vapor deposition (e.g., sputtering or evaporation).

Figure 24:
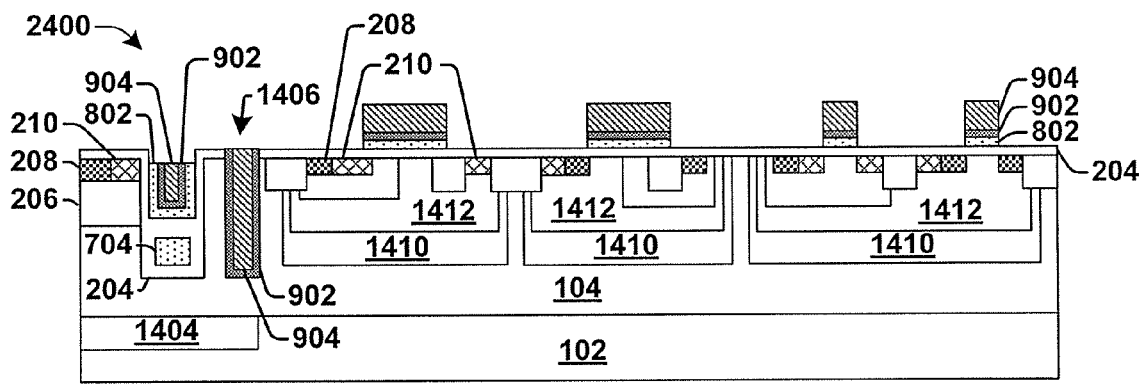

FIG. 24 illustrates a cross-sectional view 2400 of some embodiment of a semiconductor substrate corresponding to the substrate of steps 1616-1618. As shown in cross-sectional view 2400, the substrate is selectively masked and the barrier layer 902, the low resistance metal 904, and the second polysilicon layer 802 are selectively etched to define a hybrid gate electrode within trench 606, the drain electrode 1406 within the drain trench 2204, and the gates of lateral MOS devices 1408. The resulting hybrid gate electrode of the quasi-vertical power MOSFET has a plurality of nested regions, as described above. The resulting gate electrodes of the lateral MOS devices 1408 have stacked gate electrodes. Therefore, the low resistance metal 904 is used to fill trench 606 and drain trench 2204, while the same low resistance metal 904, barrier layer 902, and second polysilicon layer 802 are etched to form the gate electrodes of the quasi-vertical power MOSFET 1402 and the lateral MOS devices 1408. Cross-sectional view 2400 also illustrates the implantation of a body region 206 and first and second implantation region, 208 and 210, within the epitaxial layer 104.

Figure 25:
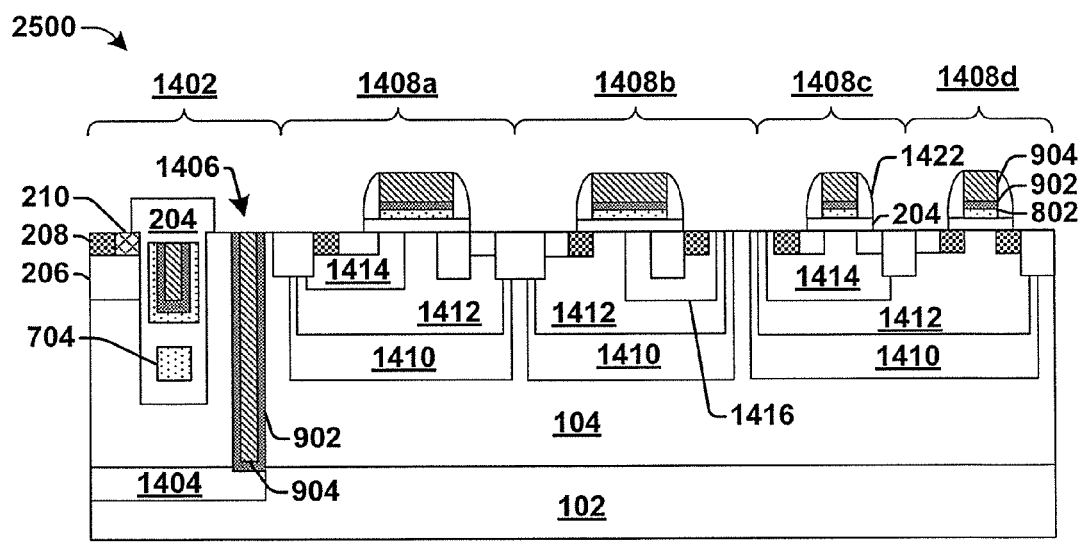

FIG. 25 illustrates a cross-sectional view 2500 of some embodiments of a semiconductor substrate corresponding to the substrate of step 1620. Cross-sectional view 2500 illustrates the formation of the gate-source dielectric and sidewall spacers 1422 on the lateral devices 1408a-1408d. The gate-source dielectric is formed by selectively etching insulating material 204 to define the gate-source dielectric of devices 1408a-1408d. The sidewall spacers 1422 are formed by depositing additional insulating material (e.g., silicon nitride, silicon oxide) over the substrate and selectively etching the additional insulating material to define the sidewalls spacers 1422.

Figure 26:
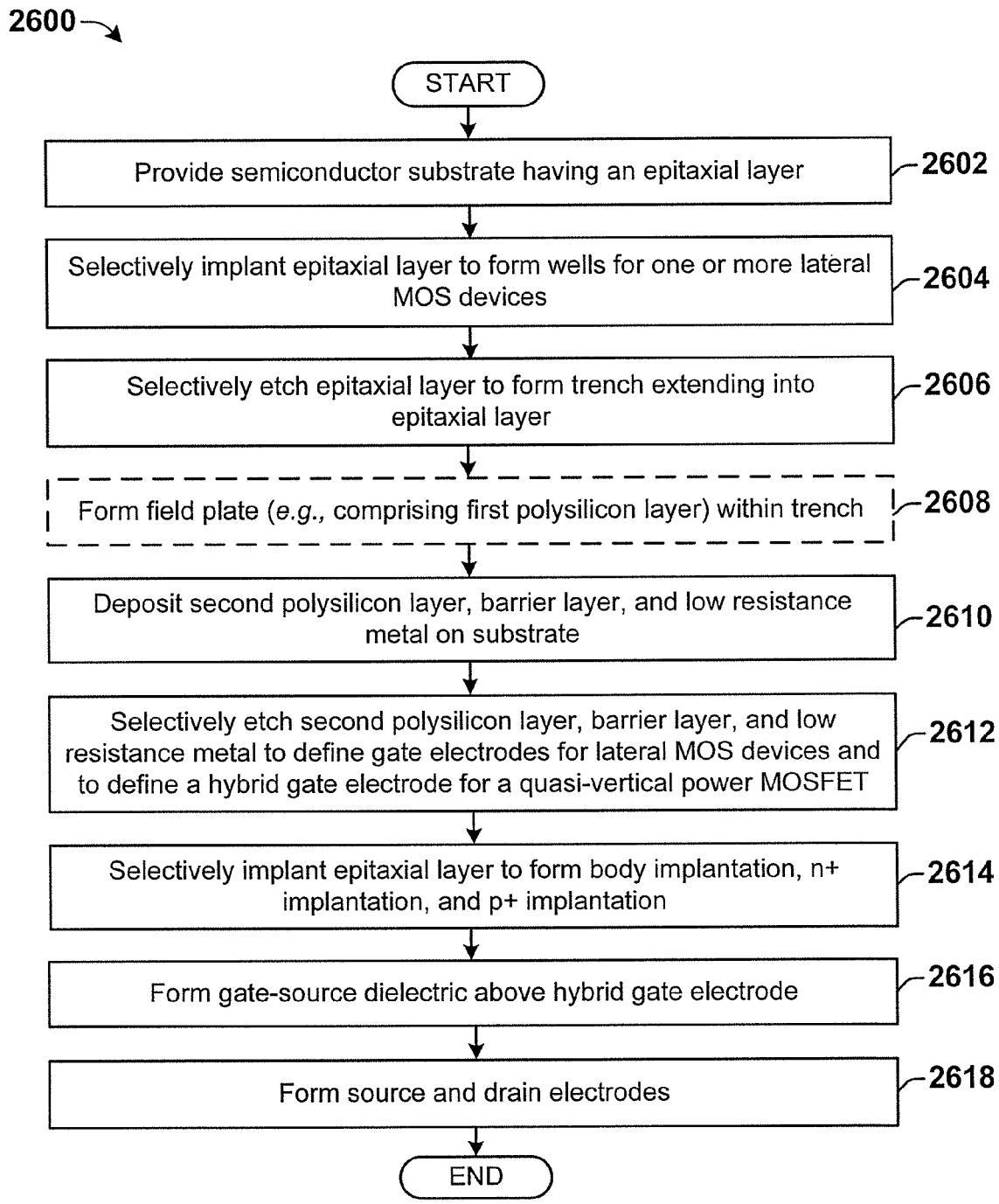
FIG. 26 illustrates a method of forming a vertical power MOSFET having a disclosed hybrid gate structure, in accordance with some embodiments.

FIG. 26 illustrates some embodiments of a method 2600 of forming an integrated vertical power MOSFET having a disclosed hybrid gate electrode.

At step 2602, a semiconductor substrate having an epitaxial layer is provided.

At step 2604, the epitaxial layer is selectively implanted to form one or more wells for one or more lateral MOS devices.

At step 2606, the semiconductor substrate is selectively etched to form a trench that extends into the epitaxial layer. The trench extends from a surface of the epitaxial layer opposite the semiconductor body to a depth within the epitaxial layer.

In some embodiments, a field plate is formed within the trench at step 2608. In some embodiments, the field plate comprises a first polysilicon layer formed in the trench and surrounded by an insulating material.

At step 2610, a second polysilicon layer, a barrier layer, and a low resistance metal are deposited on the surface of the substrate.

At step 2612, the second polysilicon layer, the barrier layer, and the low resistance metal are selectively etched to define gate electrodes for the lateral MOS devices and to define a hybrid gate electrode for a vertical power MOSFET device.

At step 2614, the epitaxial layer is selectively implanted to form a body implantation region, a p+ implantation region, and an n+ implantation region.

At step 2616, a gate-source dielectric is formed above the hybrid gate electrode.

At step 2618, source and drain electrodes are formed. The source electrode is formed on a first side of the substrate, while the drain is formed on a backside of the substrate.

FIGS. 27-32 illustrate cross-sectional views of some embodiments of a semiconductor substrate, whereon such a method 2600 is implemented, are illustrated in cross-sectional views of FIGS. 27-32.

Figure 27:
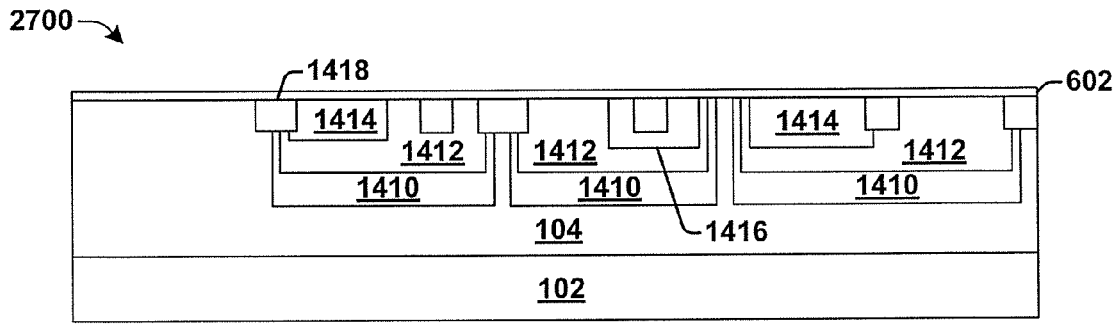
FIGS. 27-32 illustrate cross-sectional views of some embodiments of the formation of an integrated vertical power MOSFET according to the method of FIG. 26.

FIG. 27 illustrates a cross-sectional view 2700 of some embodiments of a semiconductor substrate corresponding to the substrate of steps 2602-2604. The semiconductor substrate includes a semiconductor body 102 (e.g., silicon or SiGe) and an epitaxial layer 104 formed thereover. The semiconductor body 102 and the epitaxial layer have a same doping type (e.g., n-type). One or more active areas are formed within the epitaxial layer 104 by way of implantation and are separated by insulating regions 1418. In various embodiments, the active areas may comprise a deep well 1410, a high voltage well 1412 comprised within the deep well, and a shallow well (e.g., a 5V p-well 1414, a p-well diffused drain implantation 1416) comprised within the high voltage well. The wells may be formed by doses and dopant types as described above in relation to FIG. 18

Figure 28:
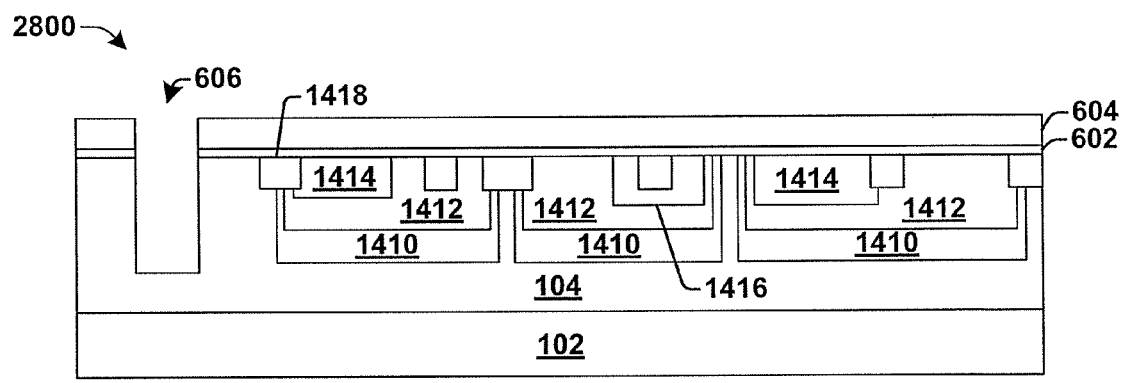

FIG. 28 illustrates a cross-sectional view 2800 of some embodiments of a semiconductor substrate corresponding to the substrate of step 2606. As shown in cross-sectional view 2800, a hard mask 604 (e.g., a nitride hard mask) is formed on the epitaxial layer 104. The hard mask 604 and underlying pad oxide 602 are selectively patterned to form an opening that exposes a region of the underlying epitaxial layer 104, which is etched to form a trench 606 within the epitaxial layer 104.

Figure 29:
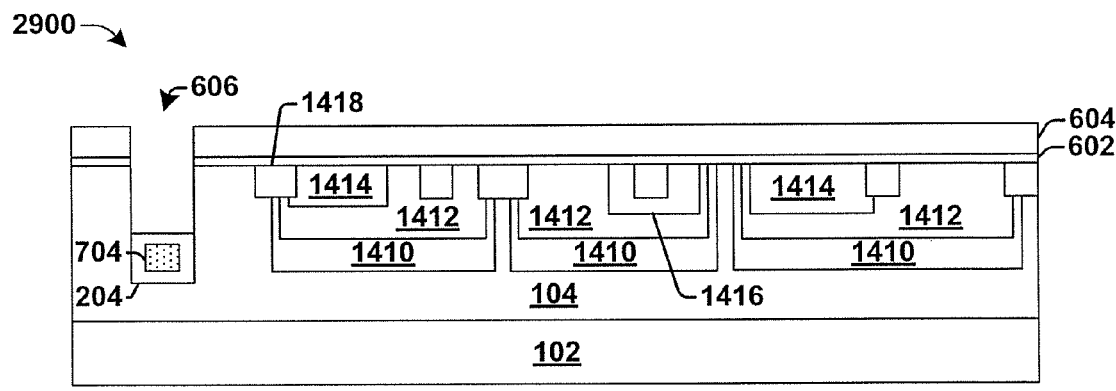

FIG. 29 illustrates a cross-sectional view 2900 of some embodiments of a semiconductor substrate corresponding to the substrate of step 2608. As shown in cross-sectional view 2900, an insulating material 204 is deposited within the trench 606. A first polysilicon layer 704 is then deposited within trench 606, and etched to define the field plate. An insulating material 204 is formed above the first polysilicon layer 704.

Figure 30:
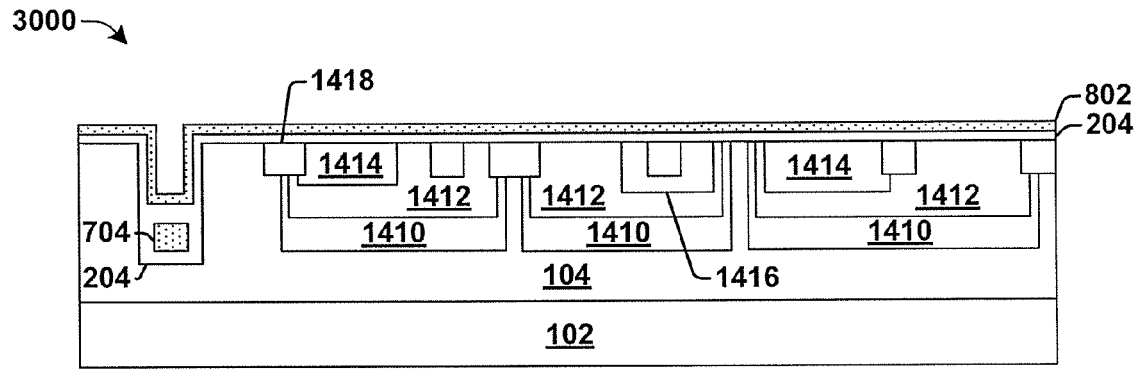

FIG. 30 illustrates a cross-sectional view 3000 of some embodiments of a semiconductor substrate corresponding to the substrate of step 2610. In cross-sectional view 3000, the pad oxide 602 and the hard mask 604 are removed from the substrate. An insulating material 204 is then formed on the substrate. A second polysilicon layer 802 is formed on the substrate above the insulating material 204. A barrier layer 902 and a low resistance metal 904 are formed on the substrate above the second polysilicon layer 802.

Figure 31:
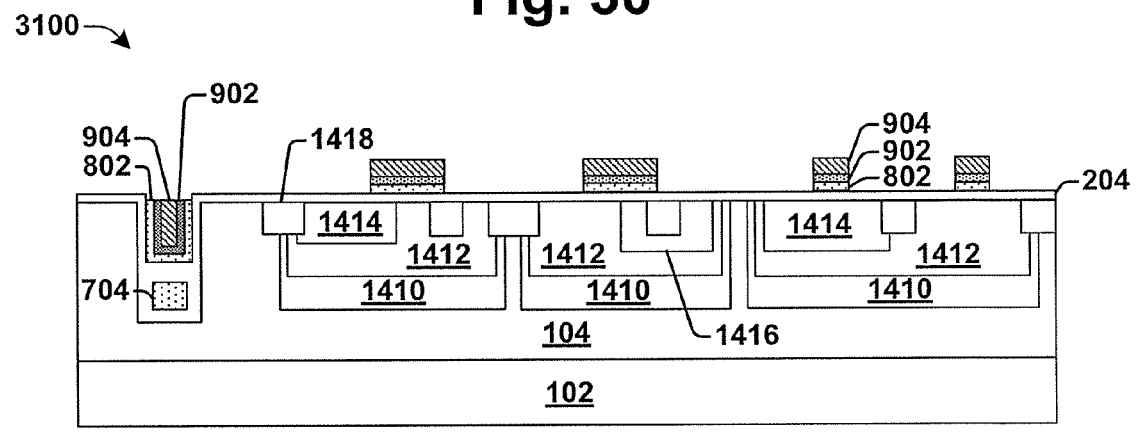

FIG. 31 illustrates a cross-sectional view 3100 of some embodiments of a semiconductor substrate corresponding to the substrate of step 2612. As shown in cross-sectional view 3100, the substrate is selectively masked and the barrier layer 902, the low resistance metal 904, and the second polysilicon layer 802 are selectively etched to define the hybrid gate electrode and the gate electrodes of lateral MOS devices 1408. The resulting hybrid gate electrode of the vertical power MOSFET has a plurality of nested regions as described above. The resulting gate electrodes of the lateral devices have stacked regions. Therefore, the low resistance metal 904 is used to fill trench 606 and drain trench 2204, while the same low resistance metal 904, barrier layer 902, and second polysilicon layer 802 are etched to form the gate electrodes of the vertical power MOSFET 1502 and the lateral MOS devices 1408.

Figure 32:
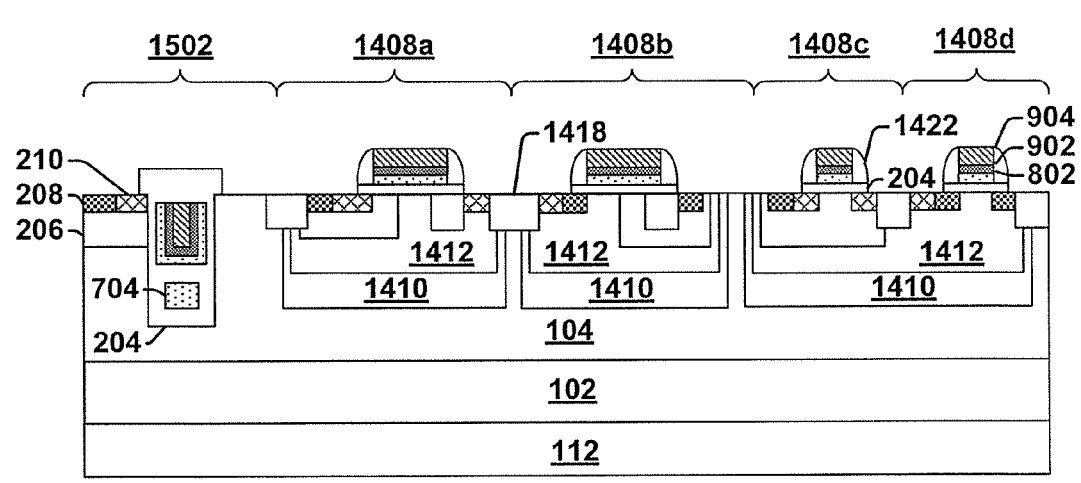

FIG. 32 illustrates a cross-sectional view 3200 of some embodiments of a semiconductor substrate corresponding to the substrate of steps 2614-2618

Cross-sectional view 3200 illustrates the implantation of a body region 206 and first and second implantation region, 208 and 210, within the epitaxial layer 104. Cross-sectional view 3200 also illustrates the formation of the gate-source dielectric of the power MOSFET and sidewall spacers on the lateral devices 1408a-1408d. The gate-source dielectric is formed by selectively etching insulating material 204 to define the gate-source dielectric of devices 1408a-1408d. The sidewall spacers 1422 are formed by depositing additional insulating material (e.g., silicon nitride, silicon oxide) over the substrate and selectively etching the additional insulating material to define the sidewalls spacers 1422.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a MOSFET transistor comprising a hybrid gate electrode having a plurality of nested regions, which has a low resistance that enables good switching performance.

In some embodiments, the present disclosure relates to a transistor device. The transistor device comprises a semiconductor substrate comprising a transistor device having a source electrode and a drain electrode. A hybrid gate electrode is located within a trench extending into the semiconductor substrate and configured to control a vertical flow of current between the source electrode and the drain electrode, wherein the hybrid gate electrode comprises a plurality of nested regions, and wherein one or more of the plurality of nested regions comprises a low resistance metal.

In another embodiment, the present disclosure relates to a power MOSFET device. The power MOSFET device comprises a semiconductor body. An epitaxial layer is disposed on the semiconductor body and comprising a trench extending into the epitaxial layer from a top surface of the epitaxial layer opposite the semiconductor body. A hybrid gate electrode is located within the trench and configured to control a flow of current between a source electrode and a drain electrode, wherein the hybrid gate electrode comprises an outer region having a polysilicon material, a barrier layer nested within the polysilicon, and a low resistance metal nested within the barrier layer and having a resistance that is less than that of the polysilicon layer.

In another embodiment, the present disclosure relates to a method of forming a power MOSFET device. The method comprises providing a semiconductor substrate having an epitaxial layer. The method further comprises selectively etching the epitaxial layer to form a trench that extends into the epitaxial layer. The method further comprises forming a hybrid gate electrode within the trench, configured to control a flow of current from a source electrode to a drain electrode, wherein the hybrid gate electrode comprises a plurality of nested regions having different materials, wherein one or more of the plurality of rested regions comprise a low resistance metal having a resistance that is less than the resistance of polysilicon.

What is claimed is:

1. A transistor device, comprising:
    a semiconductor substrate comprising an epitaxial layer disposed over a semiconductor body and a plurality of implantation regions disposed along a top surface of the epitaxial layer opposing the semiconductor body;
    a source electrode and a drain electrode located on opposite sides of the semiconductor substrate; and
    a hybrid gate electrode located within a trench extending into the semiconductor substrate and configured to control a vertical flow of current between the source electrode and the drain electrode, wherein the hybrid gate electrode comprises a plurality of nested regions that extend from a position at the top surface of the epitaxial layer to a position vertically under the plurality of implantation regions, and wherein one or more of the plurality of nested regions comprise a low resistance metal.

2. The transistor device of claim 1, wherein the low resistance metal comprises tungsten (W), titanium (Ti), Cobalt (Co), Aluminum (Al), or Copper (Cu).

3. The transistor device of claim 1, wherein the low resistance metal comprises a non-refractory metal.

4. The transistor device of claim 1, wherein the plurality of nested regions, comprise:
    an inner region comprising the low resistance metal;
    an outer region comprising a polysilicon material; and
    a barrier region disposed between the inner region and the outer region and comprising a barrier layer configured to provide good conductivity between the low resistance metal and the polysilicon material.

5. The transistor device of claim 4, wherein the low resistance metal comprises a resistance that is less than a resistance of the polysilicon material.

6. The transistor device of claim 4, wherein the barrier region comprises Cobalt (Co), tantalum (Ta), tantalum nitride (TaN), tungsten nitride (WN), titanium nitride (TiN), titanium tungsten (TiW).

7. The transistor device of claim 4,
    wherein an inside surface of the barrier layer abuts the low resistance metal on two or more sides; and
    wherein an outside surface of the barrier layer abuts the polysilicon material on two or more sides.

8. The transistor device of claim 4, further comprising:
    one or more lateral MOSFET devices located within the semiconductor substrate, wherein the one or more lateral MOSFET devices comprise gate electrodes having a stacked structure comprising the polysilicon material, the barrier layer, and low resistance metal.

9. The transistor device of claim 1, further comprising:
    a field plate disposed between the gate electrode and the drain electrode and configured to influence channel characteristics within a drain region comprising the epitaxial layer.

10. A power MOSFET device, comprising:
a semiconductor body;
an epitaxial layer disposed on the semiconductor body and comprising a trench extending into the epitaxial layer from a top surface of the epitaxial layer opposite the semiconductor body; and
a hybrid gate electrode located within the trench and configured to control a flow of current between a source electrode and a drain electrode, wherein the hybrid gate electrode comprises an outer region having a polysilicon material, a barrier layer nested within the polysilicon material, and a low resistance metal nested within the barrier layer and having a resistance that is less than that of the polysilicon material,
wherein widths extending between sidewalls of the outer region, the barrier layer, and the low resistance metal are different and wherein heights extending between top surfaces and bottom surfaces of the outer region, the barrier layer, and the low resistance metal are different.

11. The power MOSFET device of claim 10, further comprising:
a field plate disposed between the gate electrode and the drain electrode and configured to influence channel characteristics within a drain region comprising the epitaxial layer.

12. The power MOSFET device of claim 10,
wherein an inside surface of the barrier layer abuts the low resistance metal on two or more sides; and
wherein an outside surface of the barrier layer abuts the polysilicon material on two or more sides.

13. The power MOSFET device of claim 10, wherein the low resistance metal comprises tungsten (W), titanium (Ti), Cobalt (Co), Aluminum (Al), or Copper (Cu).

14. The power MOSFET device of claim 10, wherein the barrier layer comprises Cobalt (Co), tantalum (Ta), tantalum nitride (TaN), tungsten nitride (WN), titanium nitride (TiN), titanium tungsten (TiW).

15. A method of forming a power MOSFET device, comprising:
providing a semiconductor substrate having an epitaxial layer;
selectively etching the epitaxial layer to form a trench that extends into the epitaxial layer; and
forming a hybrid gate electrode within the trench, configured to control a flow of current from a source electrode to a drain electrode, by:
depositing a polysilicon layer within the trench;
depositing barrier layer on the polysilicon layer, so that an outside surface of the barrier layer abuts the polysilicon layer on two or more sides;
depositing a low resistance metal on the barrier layer, so that an inside surface of the barrier layer abuts the low resistance metal on two or more sides;
selectively etching the polysilicon layer, the barrier layer, and the low resistance metal to define the hybrid gate electrode within the trench;
wherein the hybrid gate electrode comprises a plurality of nested regions having different materials, and wherein one or more of the plurality of nested regions comprise the low resistance metal having a resistance that is less than the resistance of the polysilicon layer.

16. The method of claim 15, wherein the low resistance metal comprises tungsten (W), titanium (Ti), Cobalt (Co), Aluminum (Al), or Copper (Cu).

17. The method of claim 15, further comprising:
selectively etching the polysilicon layer, the barrier layer, and the low resistance metal to define gate electrodes for one or more lateral MOSFET devices located within the epitaxial layer.

18. The method of claim 17, further comprising:
forming a nitride spacer within the trench prior to selectively implanting the epitaxial layer; and
removing the nitride spacer from within the trench after implanting the epitaxial layer;
wherein the barrier layer and the low resistance metal are deposited within the trench at a position from which the nitride spacer was removed.

19. The transistor device of claim 1, further comprising:
a body region disposed at a position abutting surfaces of the plurality of implantation regions that oppose the top surface of the epitaxial layer, wherein the epitaxial layer and the body region comprise a same doping type.

20. The transistor device of claim 4, wherein the outer region extends from a position below a bottom surface of the barrier region to a position that is even with a top surface of the barrier region.

* * * * *